(12) United States Patent
Sato et al.

(10) Patent No.: US 11,638,351 B2
(45) Date of Patent: Apr. 25, 2023

(54) COMPONENT-EMBEDDED SUBSTRATE

(71) Applicant: Fujikura Ltd., Tokyo (JP)

(72) Inventors: Masakazu Sato, Sakura (JP); Nobuki Ueta, Sakura (JP); Yoshio Nakao, Sakura (JP); Masatoshi Inaba, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 17/251,042

(22) PCT Filed: Jun. 12, 2019

(86) PCT No.: PCT/JP2019/023305
§ 371 (c)(1),
(2) Date: Dec. 10, 2020

(87) PCT Pub. No.: WO2019/240179
PCT Pub. Date: Dec. 19, 2019

(65) Prior Publication Data
US 2021/0195741 A1  Jun. 24, 2021

(30) Foreign Application Priority Data

Jun. 14, 2018 (JP) .............................. JP2018-113498
Mar. 5, 2019 (JP) .............................. JP2019-039846

(51) Int. Cl.
*H05K 1/11* (2006.01)
*H05K 1/18* (2006.01)
(Continued)

(52) U.S. Cl.
CPC ............. *H05K 1/116* (2013.01); *H05K 1/185* (2013.01); *H05K 3/0026* (2013.01);
(Continued)

(58) Field of Classification Search
CPC ....................................................... H05K 1/116
(Continued)

(56) References Cited

U.S. PATENT DOCUMENTS

2018/0242464 A1* 8/2018 Hasegawa .............. H05K 3/462

FOREIGN PATENT DOCUMENTS

| JP | 2001-217550 A | 8/2001 |
| JP | 2003-017859 A | 1/2003 |

(Continued)

OTHER PUBLICATIONS

English translation of the International Search Report issued in International Application No. PCT/JP2019/023305, dated Jul. 16, 2019 (1 page).

*Primary Examiner* — Stanley Tso
(74) *Attorney, Agent, or Firm* — Osha Bergman Watanabe & Burton LLP (57) ABSTRACT

A component-embedded substrate includes: insulating layers each including a wiring pattern; an embedded component including a connection terminal; a plurality of vias that electrically connect the connection terminal to the wiring patterns adjacent to each other in a lamination direction. Each of the vias is composed of a via hole in the insulating layer and a conductive material in the via hole. One of the vias is a connection via connected to the connection terminal, and another of the vias is an adjacent via adjacent to the connection via in the lamination direction. The connection via and adjacent via overlap in a plan view. $S1/A1 \leq 0.61$ and $S1/A2 \leq 0.61$ are satisfied, where A1 is an average cross-sectional area of the connection via, A2 is an average cross-sectional area of the adjacent via, and S1 is an overlapping area of the connection via and adjacent via in the plan view.

4 Claims, 8 Drawing Sheets

(51) Int. Cl.
  *H05K 3/00* (2006.01)
  *H05K 3/40* (2006.01)
(52) U.S. Cl.
  CPC . *H05K 3/4053* (2013.01); *H05K 2201/09563* (2013.01); *H05K 2201/09854* (2013.01)
(58) Field of Classification Search
  USPC .......................................................... 174/260
  See application file for complete search history.

(56) References Cited

FOREIGN PATENT DOCUMENTS

| | | |
|---|---|---|
| JP | 2003046215 A | 2/2003 |
| JP | 2003-347738 A | 12/2003 |
| JP | 2006-186058 A | 7/2006 |
| JP | 2009-141121 A | 6/2009 |
| JP | 2009-164285 A | 7/2009 |
| JP | 2010-034391 A | 2/2010 |
| WO | 2011/122245 A1 | 10/2011 |
| WO | 2017/038399 A1 | 3/2017 |

* cited by examiner

COMPONENT-EMBEDDED SUBSTRATE

CROSS-REFERENCE TO RELATED APPLICATIONS

This is a National Stage application of International Application No. PCT/JP2019/023305 filed on Jun. 12, 2019, claims priority to Japanese Patent Application No. 2018-113498 filed Jun. 14, 2018 and Japanese Patent Application No. 2019-039846 filed Mar. 5, 2019. These references are incorporated herein by reference.

TECHNICAL FIELD

The present invention relates to a component-embedded substrate.

BACKGROUND

Conventionally, a component-embedded substrate as disclosed in Patent Document 1 is known. The component-embedded substrate has embedded components and has insulating layers and wiring patterns alternately laminated. The component-embedded substrate is provided with a plurality of vias that electrically connect adjacent wiring patterns in a lamination direction. Each via has a structure in which a via hole formed in an insulating layer is filled with a conductive material.

PATENT LITERATURE

[Patent Document 1] Japanese Unexamined Patent Application, First Publication No. 2009-164285.

When attempts are made to form a wiring pattern with a high density inside a component-embedded substrate, it is effective to employ a so-called stacked-via structure in which vias are arranged coaxially in the lamination direction.

However, as a result of diligent study by the inventors of the present application, it has been found that when a stacked via is employed, stress is likely to occur between the vias due to differences in the linear expansion coefficient between the insulating layer and the embedded component. The stress between the vias decreases the reliability of the electrical connection between the wiring patterns.

SUMMARY

One or more embodiments of the present invention provide a component-embedded substrate capable of improving the reliability of electrical connection while maintaining the density of the wiring patterns.

A component-embedded substrate according to one or more embodiments of the present invention include a plurality of insulating layers each having a wiring pattern formed on one surface and an embedded component comprising a connection terminal. The component-embedded substrate includes a plurality of vias that electrically connect the plurality of wiring patterns adjacent to each other in a lamination direction and the connection terminal, where each of the plurality of vias is composed of a via hole formed in the insulating layer and a conductive material provided in the via hole, the plurality of vias comprises a connection via directly connected to the connection terminal and an adjacent via adjacent to the connection via in the lamination direction, and the connection via and the adjacent via overlap each other in a plan view, and when the average cross-sectional area of the connection via is A1, the average cross-sectional area of the adjacent via is A2, and the overlapping area of the connection via and the adjacent via in a plan view is S1, $S1/A1 \leq 0.61$ and $S1/A2 \leq 0.61$.

The connection via and the adjacent via may be included in a via row formed of three or more vias that are adjacent to each other in the lamination direction.

In addition, the via row may include a second adjacent via that is adjacent to the adjacent via in the lamination direction, and when an average sectional area of the adjacent via is A2, an average sectional area of the second adjacent via is A3, and an overlapping area of the adjacent via and the second adjacent via in a plan view is S2, $0.9 \leq S2/A2 \leq 1.0$ and $0.9 \leq S2/A3 \leq 1.0$ may be satisfied.

In addition, the via row may include a second adjacent via that is adjacent to the adjacent via in the lamination direction, and when an average cross-sectional area of the adjacent via is A2, an average cross-sectional area of the second adjacent via is A3, and an overlapping area of the adjacent via and the second adjacent via in a plan view is S2, $S2/A2 \leq 0.61$ and $S2/A3 \leq 0.61$ may be satisfied.

In addition, when two vias included in the via row and adjacent to each other in the lamination direction are a first via and a second via, and when the average cross-sectional area of the first via is $An$, the average cross-sectional area of the second via is $An+1$, and the overlapping area of the first via and the second via in a plan view is $Sn$, $Sn/An \leq 0.61$ and $(Sn+1)/(An+1) \leq 0.61$ may be satisfied for all the vias included in the via row.

According to the above-described embodiments of the present invention, the connection via and the adjacent via overlap with each other in a plan view, and the overlapping area is arranged so as to be equal to or less than a certain ratio of the average cross-sectional area of the connection via and the adjacent via.

With this configuration, it is possible to reduce the stress between the connection via and the adjacent via, which is caused by the difference in the linear expansion coefficient between the embedded component and the insulating layer. Furthermore, since the connection via and the adjacent via overlap each other in a plan view, it is possible to suppress a decrease in the density of the wiring pattern. Therefore, it is possible to provide a component-embedded substrate capable of improving the reliability of the electrical connection between layers while maintaining the density of the wiring pattern.

BRIEF DESCRIPTION OF THE DRAWINGS

FIG. 2A-2D is a diagram showing an example of a method of manufacturing a component-embedded substrate.

DETAILED DESCRIPTION

Hereinafter, a component-embedded substrate of one or more embodiments will be described with reference to the drawings.

Figure 1:
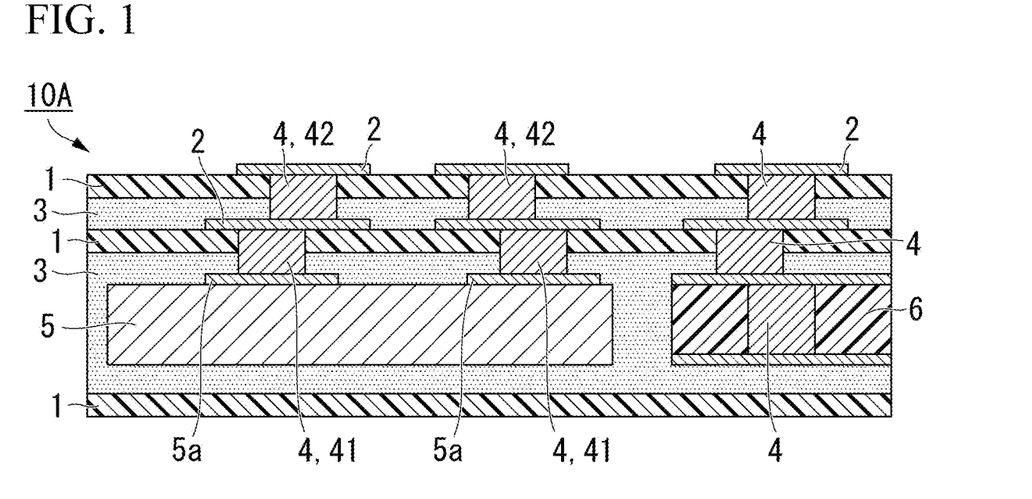
FIG. 1 is a sectional view of the component-embedded substrate according to one or more embodiments.

As shown in FIG. 1, the component-embedded substrate 10A includes a plurality of insulating layers 1 each having a wiring pattern 2 formed on one surface thereof, and a plurality of adhesive layers 3 for bonding the insulating layers 1 to each other. The component-embedded substrate 10A is provided with a plurality of vias 4 that electrically connect the wiring patterns 2 adjacent to each other in a lamination direction. The embedded component 5 having a plurality of connection terminals 5a is embedded in the component-embedded substrate 10A. A double-sided circuit board 6 is arranged between the insulating layers 1. The component-embedded substrate 10A may not have the double-sided circuit board 6.

Definition of Direction

According to one or more embodiments, the direction in which the insulating layer 1 and the wiring pattern 2 are laminated is referred to as a lamination direction. In addition, viewing from the lamination direction is referred to as a plan view, and viewing from a cross section along the lamination direction is referred to as a sectional view.

The insulating layer 1 is formed of an insulating material such as polyimide. The wiring pattern 2 is formed of a conductor such as copper. The wiring pattern 2 is formed on one surface of the insulating layer 1 and has a predetermined circuit shape. The insulating layer 1 and the wiring pattern 2 may be formed by processing a copper clad laminate (CCL). The materials of the insulating layer 1 and the wiring pattern 2 may be changed appropriately.

The adhesive layer 3 adheres the insulating layers 1 adjacent to each other in the lamination direction to each other. As the adhesive layer 3, various adhesives known in the field of manufacturing a printed wiring board can be used. For example, a polyimide-based adhesive material, an epoxy-based adhesive material, or the like is suitable as the adhesive layer 3.

The via 4 is a filled via formed by filling a conductive material into a via hole formed integrally with the insulating layer 1 and the adhesive layer 3. That is, each of the plurality of vias 4 is composed of a via hole integrally formed in the insulating layer 1 and the adhesive layer 3, and a conductive material provided in the via hole. The position and shape of the via 4 are defined by the position and shape of the via hole. The via hole is formed so as to penetrate the insulating layer 1 and the adhesive layer 3 in the lamination direction. Therefore, the via 4 is also provided so as to penetrate the insulating layer 1 and the adhesive layer 3 in the lamination direction.

Both ends of the via 4 in the lamination direction are connected to the wiring patterns 2 adjacent to each other in the lamination direction. As a result, the via 4 electrically connects the wiring patterns 2 adjacent to each other in the lamination direction. In addition, some of the vias 4 are connected to the embedded component 5. The via 4 connected to the embedded component 5 has a role of electrically connecting together the connection terminal 5a provided on the embedded component 5 and the wiring pattern 2.

As the conductive material used as the via 4, a conductive paste containing metal particles such as nickel, silver, copper, tin, bismuth, indium, and lead can be used. Alternatively, a conductive paste containing metal particles having low electric resistance such as nickel, silver and copper, and metal particles having low melting point such as tin, bismuth, indium and lead can be used.

The embedded component 5 may be a passive component such as a resistor or a capacitor, or an active component such as an IC, a diode or a transistor. The embedded component 5 is electrically connected to the wiring pattern 2 via the connection terminal 5a and the via 4.

Next, an example of a method of manufacturing the component-embedded substrate 10A will be described with reference to FIGS. 2-4. The component-embedded substrate 10A may be manufactured by other manufacturing methods.

Figure 2:
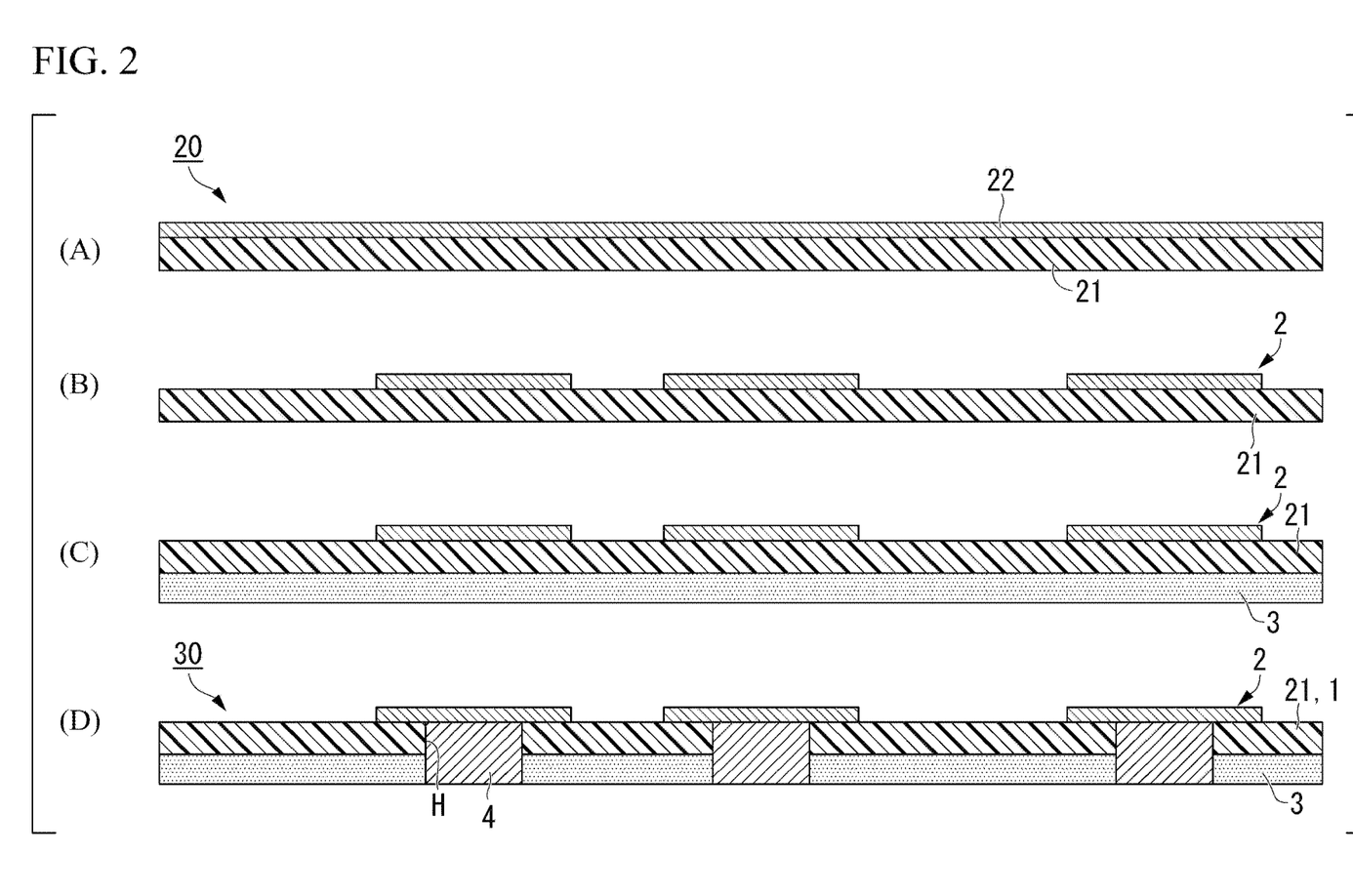

When manufacturing the component-embedded substrate 10A, for example, a plurality of copper-clad laminates (CCL) 20 as shown in part (a) of FIG. 2 are prepared. The copper-clad laminate 20 has a base material 21 and a copper foil 22. The base material 21 is a portion to be the insulating layer 1 in the component-embedded substrate 10A, and the copper foil 22 is a portion to be the wiring pattern 2.

Next, the predetermined wiring pattern 2 is obtained by etching the copper foil 22 of each copper-clad laminate 20, or the like (part (b) of FIG. 2). Next, an adhesive sheet is attached to the copper-clad laminate 20 on which the wiring pattern 2 is formed to form the adhesive layer 3 (part (c) of FIG. 2).

Next, via holes H are formed in the base material 21 (insulating layer 1) and the adhesive layer 3 by laser processing or the like. Next, the inside of the via hole H is filled with a conductive paste by screen printing or the like. The via 4 is formed by heating the conductive paste to cure the conductive paste, if necessary (part (d) of FIG. 2), or the like. Through the above steps, the laminated body 30 in which the wiring pattern 2, the insulating layer 1, and the adhesive layer 3 are laminated and the vias 4 are formed is obtained.

Figure 3:
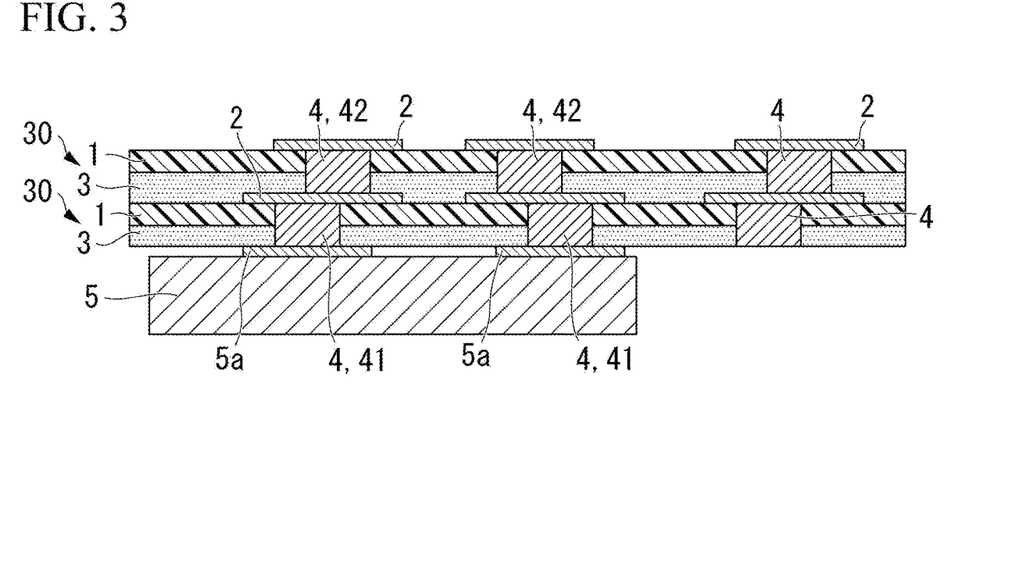
FIG. 3 is a diagram showing a step following FIG. 2D.
Figure 4:
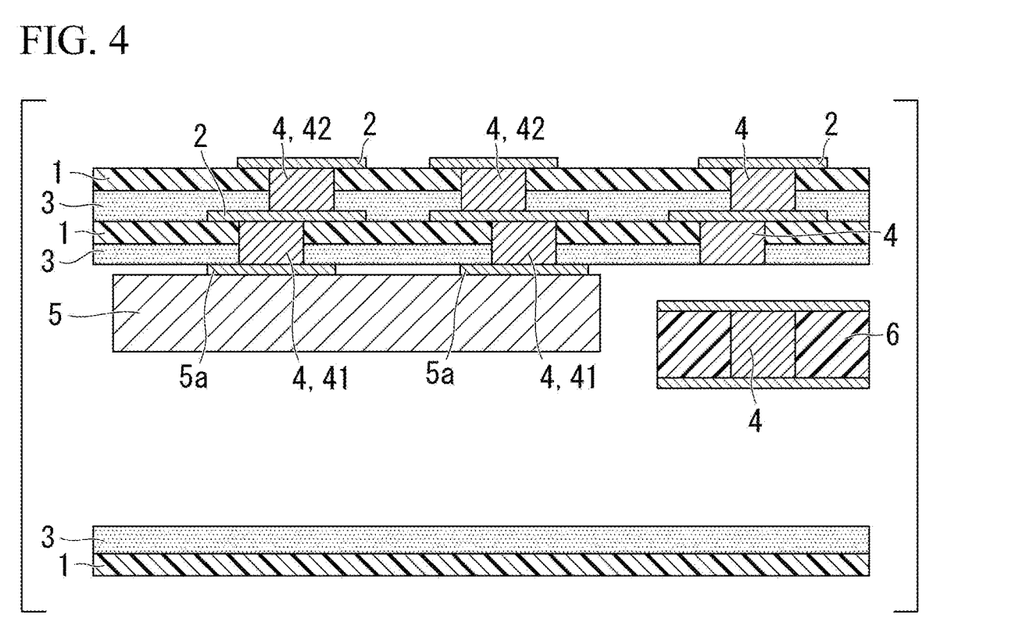
FIG. 4 is a diagram showing a step following FIG. 3.

Next, as shown in FIG. 3, a plurality of laminated bodies 30 (two in the example of FIG. 3) are laminated. Furthermore, the connection terminal 5a of the embedded component 5 and the via 4 are connected. Then, as shown in FIG. 4, the double-sided circuit board 6 is arranged beside the embedded component 5, and the insulating layer 1 provided with the adhesive layer 3 is attached from below. In such manner, the component-embedded substrate 10A can be manufactured.

Figure 11:
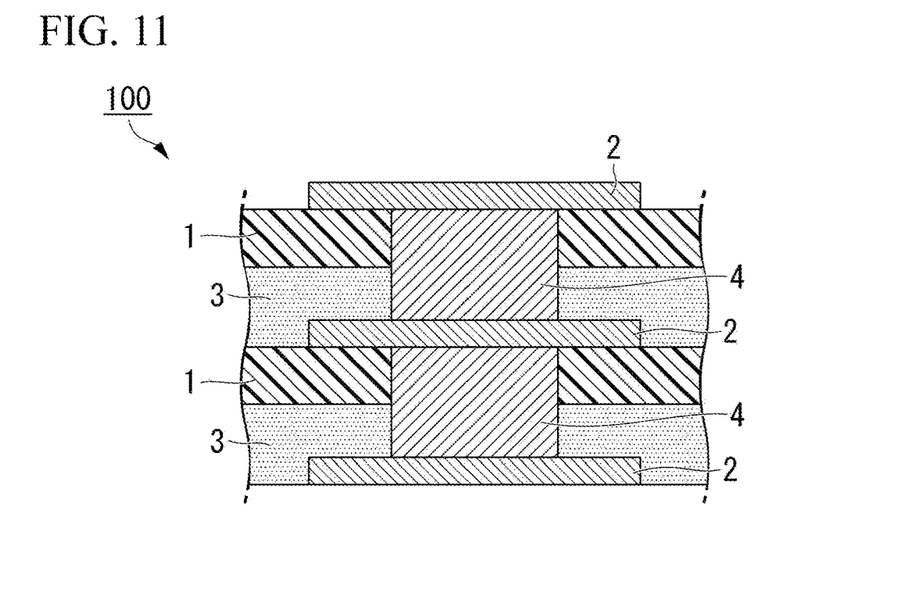
FIG. 11 is a cross-sectional view showing the structure of a stack via.

Here, the arrangement of the vias 4 will be described. Generally, in order to form the wiring pattern 2 at a high density, a so-called stacked via structure 100 as shown in FIG. 11 is often employed. In the stacked via structure 100, a plurality of vias 4 adjacent to each other in the lamination direction are arranged coaxially. In the stacked via structure 100, by stacking one via 4 directly above the other via 4, the wiring patterns 2 of three layers or more are electrically connected.

The via 4 has a role of electrically connecting the wiring patterns 2 to each other. Therefore, even if each portion of the component-embedded substrate 10A repeatedly expands and contracts due to a temperature change, it is required that the electrical connection between the wiring patterns 2 by the vias 4 be stable. However, there is a difference in the linear expansion coefficient among the conductive material used for the via 4, the insulating layer 1, and the embedded component 5.

When each portion repeatedly expands and contracts due to temperature change, strain (stress) may be generated in the via 4 due to the difference in linear expansion coefficient, and the electrical resistance of the via 4 may increase. Alternatively, depending on the material of the conductive material used for the via 4, repeated thermal stress may cause breakage at the connection portion between the vias 4.

Such a phenomenon is particularly likely to occur when a plurality of wiring patterns 2 and the connection terminals 5a of the embedded component 5 are electrically connected by the vias 4, as shown in FIG. 1. This is because stress due to temperature change is likely to occur in the via 4 due to the difference in linear expansion coefficient between the insulating layer 1 and the embedded component 5.

Figure 12:
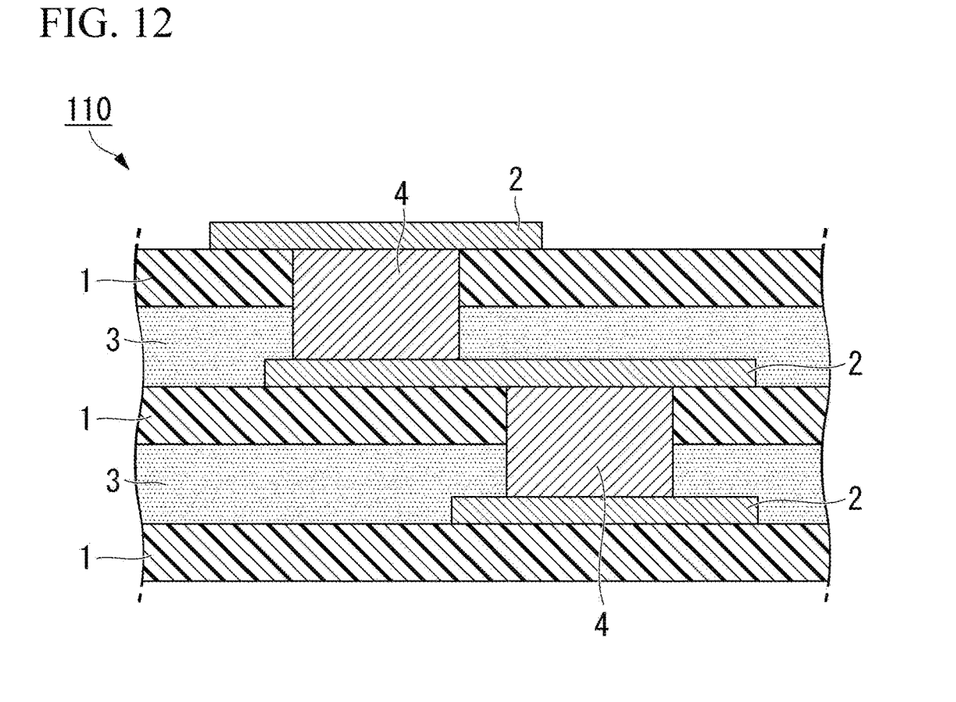
FIG. 12 is a cross-sectional view showing the structure of a staggered via.

The stress described above can be alleviated by employing a so-called staggered via structure 110 as shown in FIG. 12. In the staggered via structure 110, the vias 4 adjacent to each other in the lamination direction are arranged so as not to overlap in a plan view. However, when the staggered via structure 110 is employed, the area where the wiring pattern 2 can be formed is narrowed on one surface of the insulating layer 1. As a result, the density of the wiring pattern 2 is decreased.

Therefore, the inventors of the present application have made earnest studies, and as a result, it has been found that the reliability of the electrical connection between the layers can be improved while maintaining the density of the wiring pattern by arranging such that the vias 4 directly connected to the connection terminals 5a and the vias 4 adjacent to each other in the lamination direction overlap with each other in a plan view and the overlapping area of the vias 4 in a plan view is less than a certain ratio of the average cross-sectional area of each via 4. The details will be described below.

Hereinafter, the via 4 directly connected to the connection terminal 5a is referred to as a connection via 41, and the via 4 adjacent to the connection via 41 in the lamination direction is referred to as an adjacent via 42. As shown in FIG. 1, the connection via 41 and the adjacent via 42 are arranged adjacent to each other in the lamination direction and partially overlap each other in a plan view. The connection via 41 and the adjacent via 42 are included in the plurality of vias 4 included in the component-embedded substrate 10A. A portion of the plurality of vias 4 included in the component-embedded substrate 10A may correspond to the connection via 41 or the adjacent via 42 described below. Alternatively, all the vias 4 may correspond to the connection vias 41 or the adjacent vias 42. The connection via 41 and the adjacent via 42 have a circular shape in a plan view.

Figure 5:
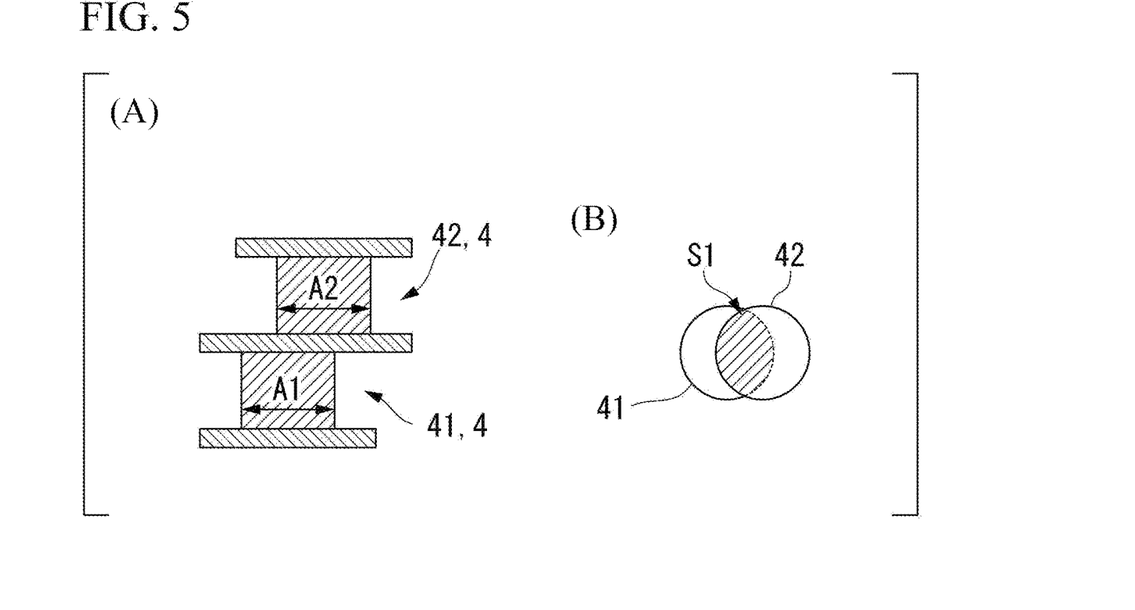
FIG. 5A is a cross-sectional view of the connection via and the adjacent via extracted from FIG. 1.
FIG. 5B is a plan view of FIG. 5A.

FIG. 5A is a schematic diagram in which the connection via 41 and the adjacent via 42 are extracted. FIG. 5B is a plan view of FIG. 5A. As shown FIG. 5A, the average sectional area of the connection via 41 is referred to as a connection via sectional area A1, and the average sectional area of the adjacent via 42 is referred to as an adjacent via sectional area A2. In the present specification, the "average cross-sectional area" is the average value in the lamination direction of the cross-sectional area of the via 4 in the cross section orthogonal to the lamination direction. For example, when the via 4 has an accurate cylindrical shape, the average cross-sectional area of the via 4 is equal to the cross-sectional area of the cylindrical shape at arbitrary position.

When the via 4 is formed, for example, in a truncated cone shape, the average value of the cross-sectional area at the upper end and the cross-sectional area at the lower end of the via 4 is the average cross-sectional area.

According to one or more embodiments, as shown in FIG. 5B, a portion of the connection via 41 and a portion of the adjacent via 42 overlap each other in a plan view. In the present specification, the overlapping area of the connection via 41 and the adjacent via 42 in a plan view is represented by S1.

EXAMPLES

Here, the results of examining the ratio of the average cross-sectional area of the connection via 41 or the adjacent via 42 to the overlapping area, that is, the range of the value of S1/A1 or the value of S1/A2 will be described by using examples.

Figure 6:
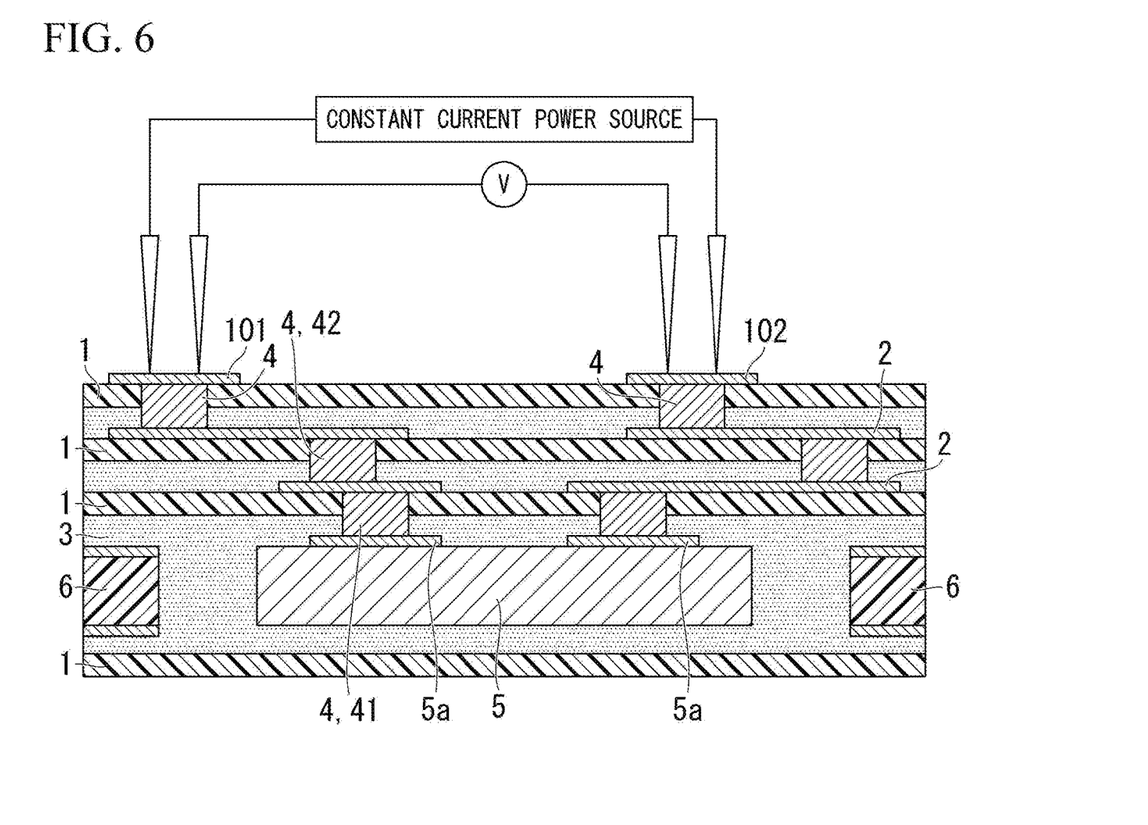
FIG. 6 is an explanatory diagram when measuring electrical resistance by the four-terminal method in an Example.

In the present example, a component-embedded substrate as shown in FIG. 6 was produced. The component-embedded substrate has a daisy-chain circuit composed of two layers of wiring patterns 2 and an embedded component 5. The material of the wiring pattern 2 is copper. As the conductive material of the via 4, a sintered conductive paste having a lower elastic modulus and a larger coefficient of linear expansion than copper was used. The via 4 was formed by filling the inside of the via hole with the sintered conductive paste.

In addition, the pair of connection vias 41 and adjacent vias 42 described in the above-described embodiment are provided. All the vias 4 except the connection via 41 and the adjacent via 42 have a staggered via structure.

Although a plurality of samples were prepared in the present example, the connection via 41 and the adjacent via 42 had a cylindrical shape with a diameter of 100 m. That is, in all the samples, the values of the cross-sectional area A1 and the adjacent via cross-sectional area A2 are constant at 7853 $\mu m^2$.

On the other hand, the overlapping area S1 was changed by changing the relative position of the connection via 41 and the adjacent via 42 for each sample. That is, the values of S1/A1 are different in each sample. Since the cross-sectional area A1 of the connection via and the cross-sectional area A2 of the adjacent via have the same value, S1/A1=S1/A2 is satisfied.

The measurement system shown in FIG. 6 will be described in more detail. The measurement system employs the so-called 4-terminal method. That is, two measuring terminals 101 and 102 are set on the surface layer of the component-embedded substrate, and the terminals of the constant current power source and the voltmeter are connected to the measuring terminals 101 and 102, respectively. As a constant current power source, a DC standard voltage/current generator 2553 manufactured by Yokogawa Electric Corporation was used. A multimeter 2001 manufactured by Keithley Instruments, Inc. was used as a voltmeter, and a measurement current was 1 mA. In addition to the above-described measuring instruments, measuring instruments having similar specifications can be used for the measurement.

In this measurement system, the electrical resistance of the daisy chain circuit from the measurement terminal 101 to the measurement terminal 102 via the adjacent via 42, the connection via 41, and the embedded component 5 can be measured. Then, by measuring the value of the electrical resistance in the daisy chain circuit before and after the thermal shock test and calculating the difference between the two, the amount of change in the electrical resistance due to the thermal shock test can be obtained. In addition, for each sample having a different value of S1/A1, it is possible to confirm the relationship between the value of S1/A1 and the reliability against thermal shock by obtaining the amount of change in electrical resistance due to the thermal shock test.

In the case of S1/A1=S1/A2=1.0, a so-called stack via structure sample in which the connection via 41 and the adjacent via 42 are coaxially arranged is shown. When S1/A1=S1/A2=0, a sample of a staggered via structure in which the connection via 41 and the adjacent via 42 do not overlap each other in a plan view is shown.

Figure 7:
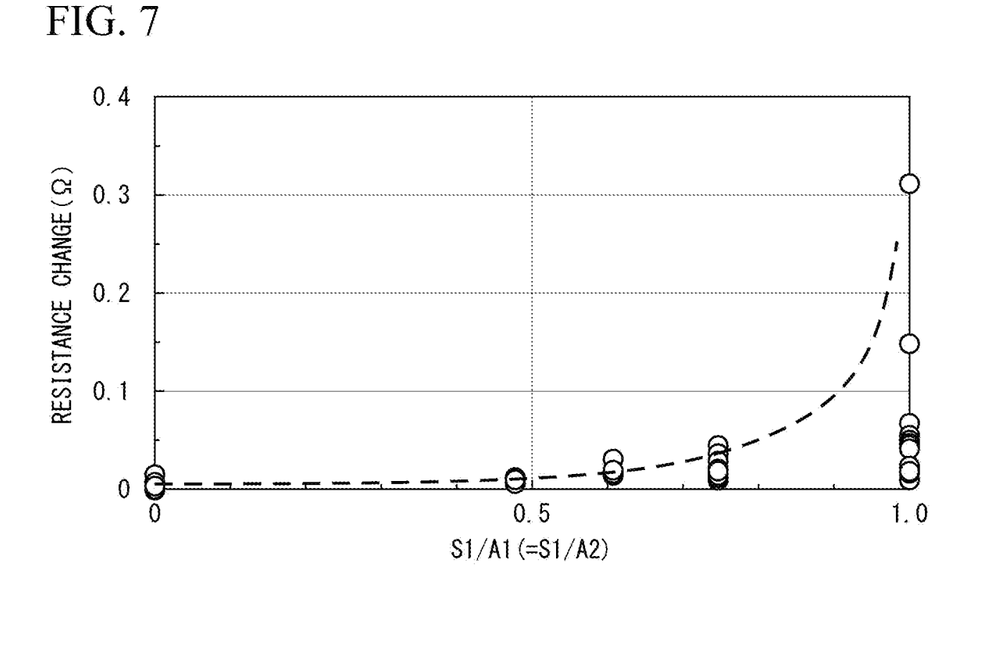
FIG. 7 is a graph showing the relationship between the value of S1/A1 and the resistance change.

The horizontal axis of FIG. 7 indicates the values of S1/A1 and S1/A2 described above, and the ordinate indicates the amount of change (Ω) in electrical resistance before and after the thermal shock test. As shown in FIG. 7, the larger the values of S1/A1 and S1/A2, the larger the electrical resistance by the thermal shock test becomes. It is considered that this is because as the values of S1/A1 and S1/A2 increase, the ratio of the overlapping area S1 becomes larger and stress is more likely to be transmitted between the connection via 41 and the adjacent via 42.

The increased amount of the electric resistance in the sample of S1/A1=S1/A2=0.48 is the same as that in the case of S1/A1=S1/A2=0. On the other hand, in the sample of S1/A1=S1/A2=0.61, the electric resistance is slightly increased. When the values of S1/A1 and S1/A2 exceed 0.75, a large increase in electrical resistance is observed.

From the above, it is found that the values of S1/A1 and S1/A2 may be 0.61 or less, and 0.48 or less.

In such a manner, the connection via 41 and the adjacent via 42 overlap each other in a plan view, and the overlapping area in a plan view is arranged to be equal to or less than a certain ratio of the average cross-sectional area of the connection via 41 and the adjacent via 42. As a result, the reliability of the electrical connection between the layers can be improved while maintaining the density of the wiring pattern 2.

In particular, stress due to temperature change was applied by setting the ratio of the cross-sectional area of the connection via 41 or the adjacent via 42 to the overlapping area, that is, the value of S1/A1 and S1/A2 to 0.61 or less. Even after that, it is possible to provide the component-embedded substrate 10A in which an increase in electrical resistance is reduced.

In addition, by setting the values of S1/A1 and S1/A2 to 0.48 or less, the reliability of electrical connection can be improved to the same level as the staggered via structure.

Since the connection via 41 and the adjacent via 42 overlap each other in a plan view, the values of S1/A1 and S1/A2 increase than 0.

The larger the values of S1/A1 and S1/A2, the denser the vias 4 can be arranged. For example, when an IC is used as the embedded component 5 in FIG. 1, the vias 4 may need to be densely arranged because the connection terminals of the IC are arranged at a small pitch. In such a case, by setting the values of S1/A1 and S1/A2 to, for example, 0.48 or more and 0.61 or less, reliability of electrical connection of the vias 4 can be ensured while the vias 4 are densely arranged.

Next, one or more embodiments of the present invention where the basic configuration is the same as that of the embodiments described above will be described. Therefore, the same reference numerals are given to the same configurations, the description thereof will be omitted, and only different points will be described.

According to one or more embodiments, a case will be described in which three or more vias 4 are adjacent to each other in the lamination direction and partially overlap each other in a plan view.

Figure 8:
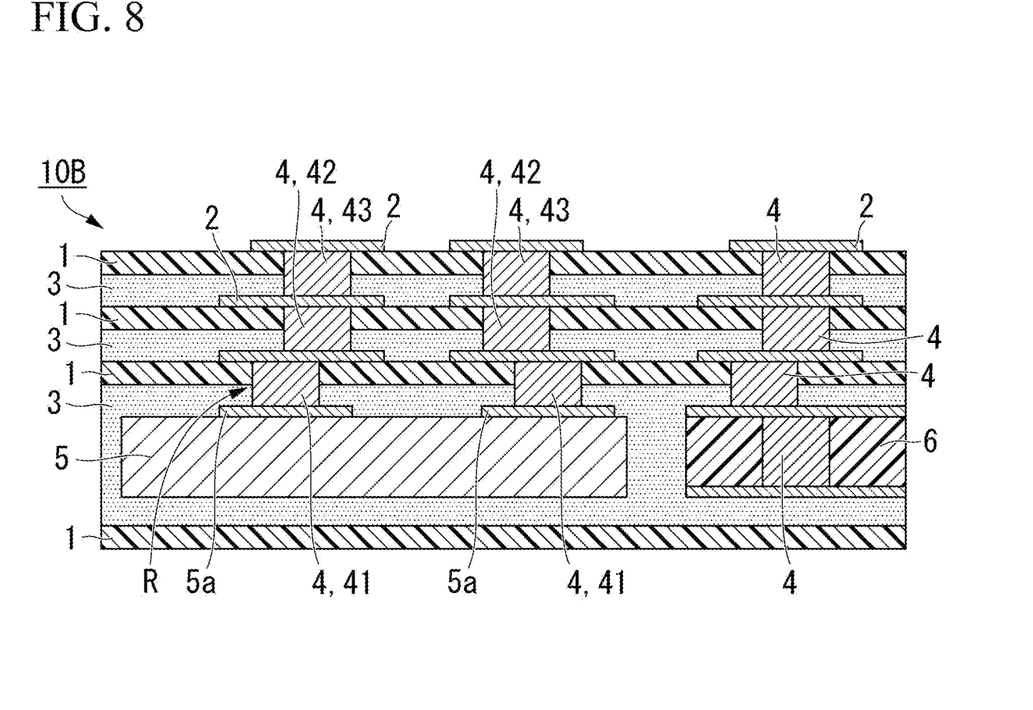
FIG. 8 is a cross-sectional view of a component-embedded substrate according to one or more embodiments.

As shown in FIG. 8, the component-embedded substrate 10B, according to one or more embodiments, has a second adjacent via 43 that is further adjacent to the adjacent via 42. In the following description, a row including three or more vias 4 that are adjacent to each other in the lamination direction is referred to as a "via row R". In the example of FIG. 8, the via row R is configured by the connection via 41, the adjacent via 42, and the second adjacent via 43.

Similar to the previously described embodiment, the connection via 41 and the adjacent via 42 according to one or more embodiments overlap each other in a plan view, and are arranged such that the overlapping area in a plan view is equal to or less than a constant ratio of the average cross-sectional area of the connection via 41 and the adjacent via 42. On the other hand, the adjacent via 42 and the second adjacent via 43 are arranged coaxially. By arranging the adjacent via 42 and the second adjacent via 43 coaxially in such a manner, the density of the wiring pattern 2 can be improved. In particular, when the average cross-sectional area of the second adjacent via 43 is A3 and the overlapping area of the adjacent via 42 and the second adjacent via 43 in a plan view is S2, may be 0.9≤S2/A2≤1.0 and 0.9≤S2/A3≤1.0.

A stress is generated between the connection via 41 and the adjacent via 42 due to a difference in linear expansion coefficient between the embedded component 5 and the insulating layer 1. On the other hand, the adjacent via 42 and the second adjacent via 43 are not directly connected to the embedded component 5. Therefore, the stress applied between the adjacent via 42 and the second adjacent via 43 is smaller than the stress applied between the connection via 41 and the adjacent via 42. Therefore, even if the arrangement is such that 0.9≤S2/A2≤1.0 and 0.9≤S2/A3≤1.0, there is little influence on the reliability of the electrical connection.

Figure 9:
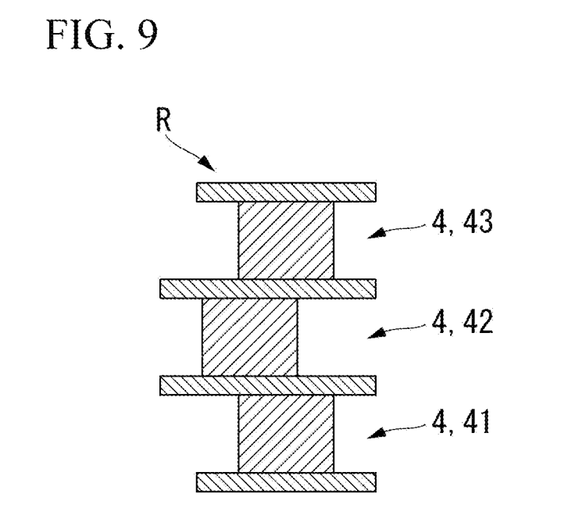
FIG. 9 is a cross-sectional view showing a first modification example of the via row.

The arrangement of the vias 4 included in the via row R can be changed as appropriate. For example, a via row R as shown in FIG. 9 may be employed. In the example of FIG. 9, the arrangement may be such that the adjacent via 42 and the second adjacent via 43 partially overlap each other in a plan view, and the overlapping area in a plan view is equal to or less than a constant ratio of the average cross-sectional area of the adjacent via 42 and the second adjacent via 43. In particular, the ratio of the average cross-sectional area of the adjacent via 42 or the second adjacent via 43 to the overlapping area, that is, the value of S2/A2 and S2/A3 may be 0.61 or less. Even in such a structure, the reliability of the electrical connection by the vias 4 can be ensured while the vias 4 are densely arranged as in the previously described embodiments.

Figure 10:
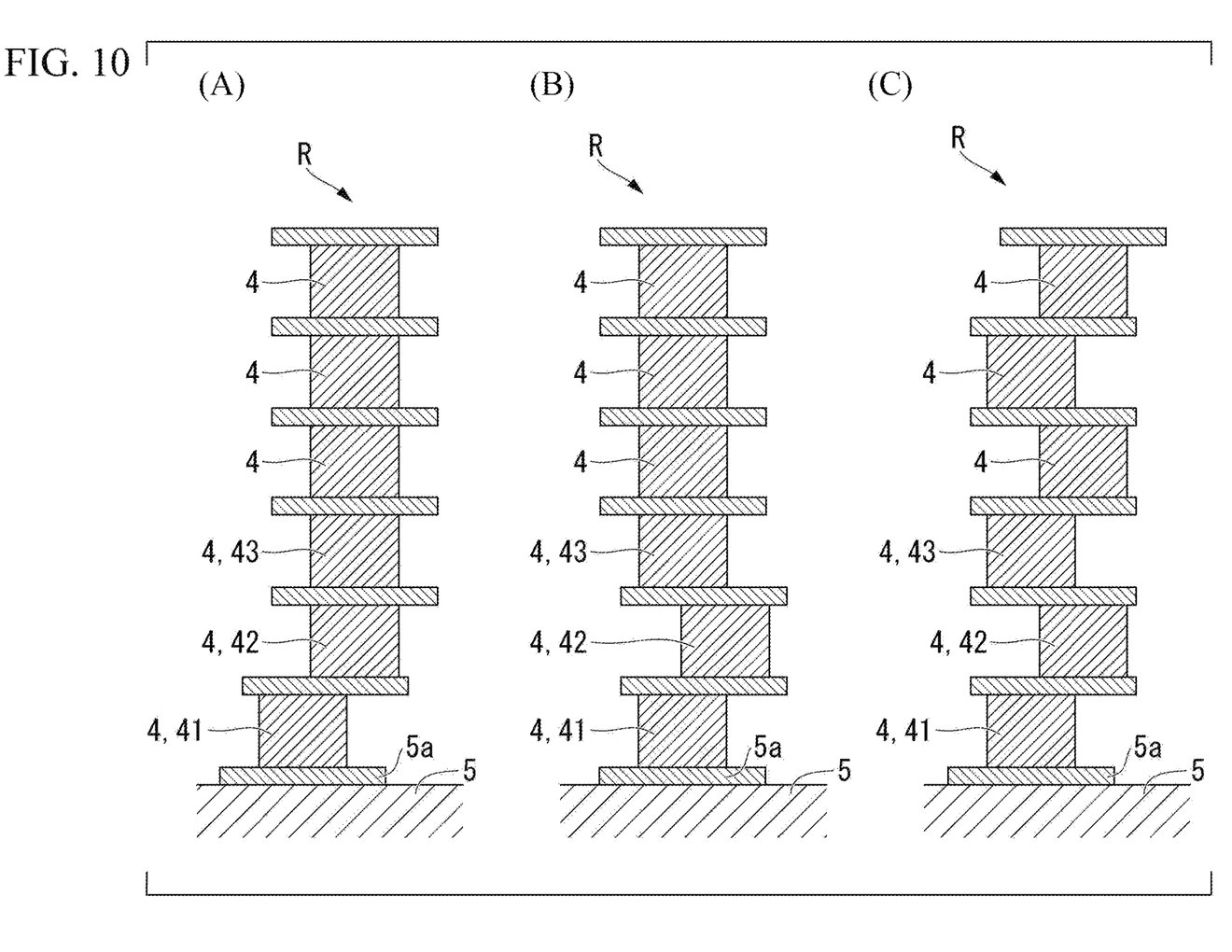
FIG. 10A to FIG. 10C are diagrams showing a second modification example of the via row.

In addition, as shown in FIG. 10A to FIG. 10C, a via row R composed of four or more vias 4 may be formed.

The via row R in FIG. 10A to FIG. 10C has six vias 4 including a connection via 41, an adjacent via 42, and a second adjacent via 43. The plurality of vias 4 in FIG. 10A to FIG. 10C are adjacent to each other in the lamination direction and at least partially overlap each other in a plan view.

In the via row R in FIG. 10A to FIG. 10C, the connection via 41 and the adjacent via 42 are arranged such that the overlapping area of the connection via 41 and the adjacent via 42 in a plan view is equal to or less than a certain ratio of the average cross-sectional area of the connection via 41 and the adjacent via 42. However, the adjacent via 42, the second adjacent via 43, and the remaining three vias 4 are coaxially arranged. In such a configuration, while reducing the stress being transmitted between the connection via 41 and the adjacent via 42, the remaining vias 4 can be arranged coaxially to improve the density of the wiring pattern.

In the via row R in FIG. 10B, the overlapping area of the connection via 41 and the adjacent via 42 in a plan view is arranged such that the average cross-sectional area of the connection via 41 and the adjacent via 42 is equal to or less than a certain ratio. Moreover, the overlapping area of the adjacent via 42 and the second adjacent via 43 in a plan view is arranged to be equal to or less than a certain ratio of the average cross-sectional area of the adjacent via 42 and the second adjacent via 43. According to such a configuration, stress being transmitted between the connection via 41 and the adjacent via 42 and between the adjacent via 42 and the second adjacent via 43 can be reduced. In addition, since the remaining vias 4 are arranged coaxially, the density of the wiring pattern can be improved.

In the via row R in FIG. 10C, it is arranged such that six vias 4 are adjacent to each other in the lamination direction in a cross-sectional view, and the overlapping area of each via 4 in a plan view is a constant ratio of the average cross-sectional area of each via 4. For generalization, an arbitrary via included in the via row R is referred to as a first via, a via adjacent to the first via in the lamination direction is referred to as a second via, and an average sectional area of the first via is An. The average cross-sectional area of the second via is called An+1. When the overlapping area of the first via and the second via in a plan view is represented by Sn, the ratio of the average cross-sectional area of the first via and the second via to the overlapping area, that is, the value of Sn/An and Sn/(An+1) may be 0.61 or less. In such a case, thermal stress is less likely to be transmitted in the lamination direction, as compared with the structures of FIG. 10A to FIG. 10C. Therefore, the reliability of electrical connection can be further improved.

Note that $Sn/An \leq 0.61$ and $(Sn+1)/(An+1) \leq 0.61$ may be satisfied for all vias included in the via row R.

The technical scope of the present invention is not limited to the above-mentioned embodiments, and various modifications can be made without departing from the spirit of the present invention.

For example, electronic components may be mounted on the surfaces of the component-embedded boards 10A and 10B shown in FIGS. 1 and 8.

In addition, the component-embedded substrates 10A and 10B may not have the adhesive layer 3. In this case, for example, the insulating layer 1 is formed of a thermosetting resin or a thermoplastic resin, and the insulating layer 1 having the wiring pattern 2 formed on one surface is laminated and heated to fix the insulating layers 1 to each other.

FIG. 7 shows the data when the diameter of the connection via 41 and the adjacent via 42 is 100 μm; however, even if the sizes of the vias 41 and 42 are different, the values of S1/A1 and S1/A2 are 0. By setting the ratio to 0.61 or less (may be 0.48 or less), the same operational effect can be obtained.

Furthermore, in the above-described embodiments, the via 4 has a circular shape in a plan view; however, may have a non-circular shape such as an ellipse, an oval, or a polygon. Also in this case, the definitions of the connection via cross-sectional area A1, the adjacent via cross-sectional area A2, the second adjacent via cross-sectional area A3, the overlapping area S1, and the overlapping area S2 are the same as those in the above-described embodiments.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

For example, in one or more embodiments, the via 4 was formed by filling the via hole with the conductive paste; however, the via 4 may be formed by plating the via hole with copper or the like.

REFERENCE SYMBOLS

1: Insulating layer, 2: Wiring pattern, 3: Adhesive layer, 4: Via, 5: Embedded component, 5a: Connection terminal, 10A, 10B: Component-embedded substrate, 41: Connection via, 42: Adjacent via, 43: Second adjacent via

The invention claimed is:
1. A component-embedded substrate comprising:
a plurality of insulating layers each comprising a wiring pattern formed on one surface;
an embedded component comprising a connection terminal, the plurality of insulating layers being laminated on the connection terminal;
a plurality of vias that electrically connect the connection terminal to the wiring patterns adjacent to each other in a lamination direction; and
a connection via and a first adjacent via that are included in a via row formed of three or more vias, among the plurality of vias, that are adjacent to each other in the lamination direction, wherein
each of the plurality of vias is composed of a via hole formed in the respective insulating layer of the plurality of the insulating layers and a conductive material provided in the via hole,
the via row comprises:
one of the plurality of vias which is the connection via directly connected to the connection terminal; and
another of the plurality of vias which is the first adjacent via adjacent to the connection via in the lamination direction, wherein
the via row is connected to the wiring pattern formed on a surface of a top insulating layer,
a center of any one of the vias of the via row is offset in a direction perpendicular to the lamination direction, from a center of any another of the vias of the via row,
the via row includes an overlapping portion in which all of the vias included in the via row and the connection terminal overlap in a plan view, and
the connection via and the first adjacent via overlap each other in a plan view,
$S1/A1 \leq 0.61$ and $S1/A2 \leq 0.61$ are satisfied, where
A1 is an average cross-sectional area of the connection via,
A2 is an average cross-sectional area of the first adjacent via, and
S1 is an overlapping area of the connection via and the first adjacent via in the plan view,
the via row includes a second adjacent via that is adjacent to the first adjacent via in the lamination direction, and
the first adjacent via and the second adjacent via are coaxially arranged.

2. The component-embedded substrate according to claim 1, wherein:
the via row includes a second adjacent via that is adjacent to the first adjacent via in the lamination direction, and
S2, $0.9 \leq S2/A2 \leq 1.0$ and $0.9 \leq S2/A3 \leq 1.0$ are satisfied, where
A2 is an average cross-sectional area of the first adjacent via,
A3 is an average cross-sectional area of the second adjacent via, and
S2 is an overlapping area of the first adjacent via and the second adjacent via in the plan view.

3. The component-embedded substrate according to claim 1, wherein:
the via row includes a second adjacent via that is adjacent to the first adjacent via in the lamination direction, and
S2, $S2/A2 \leq 0.61$ and $S2/A3 \leq 0.61$ are satisfied, where
A2 is an average cross-sectional area of the first adjacent via,
A3 is an average cross-sectional area of the second adjacent via, and
S2 is an overlapping area of the first adjacent via and the second adjacent via in the plan view.

4. The component-embedded substrate according to claim 1, wherein
$Sn/An \leq 0.61$ and $(Sn+1)/(An+1) \leq 0.61$ are satisfied for any two of the vias in the via row that are adjacent to each other in the lamination direction, where
An is the average cross-sectional area of one of the two vias,
An+1 is the average cross-sectional area of the other of the two vias, and
Sn is the overlapping area of the two vias in the plan view.

* * * * *